US011429776B1

(12) United States Patent
Chokhani et al.

(10) Patent No.: US 11,429,776 B1
(45) Date of Patent: Aug. 30, 2022

(54) FAULT RULES FILES FOR TESTING AN IC CHIP

(71) Applicant: Cadence Design Systems, Inc., San Jose, CA (US)

(72) Inventors: Arvind Chokhani, Murphy, TX (US); Joseph Michael Swenton, Owego, NY (US); Santosh Subhaschandra Malagi, Endicott, NY (US)

(73) Assignee: CADENCE DESIGN SYSTEMS, INC., San Jose, CA (US)

( * ) Notice: Subject to any disclaimer, the term of this patent is extended or adjusted under 35 U.S.C. 154(b) by 0 days.

(21) Appl. No.: 17/181,470

(22) Filed: Feb. 22, 2021

(51) Int. Cl.
*G06F 30/398* (2020.01)

(52) U.S. Cl.
CPC .................................. *G06F 30/398* (2020.01)

(58) Field of Classification Search
CPC ...... G06F 30/30; G06F 30/33; G06F 2115/08; G06F 30/327; G06F 2119/06; G06F 30/398; G06F 30/392; G06F 30/39; G06F 11/2273; G06F 2117/06; G06F 30/31; G06F 30/3308; G06F 30/367; G06F 2111/08; G06F 2119/02; G06F 2119/12; G06F 2119/18; G06F 30/3312; G06F 30/333; G03F 9/7076; G03F 9/7084; H01L 27/0688; H01L 27/0207; H01L 2924/14; H01L 21/76831; H01L 21/823807; H01L 21/823871; H01L 23/5226; H01L 23/573; H01L 27/092; H01L 21/768; H01L 2224/16225; H01L 2224/32145; H01L 2224/32225; H01L 2224/48091; H01L 2224/48227; H01L 2224/73204; H01L 2224/73265; H01L 23/5252;

(Continued)

(56) References Cited

U.S. PATENT DOCUMENTS 7,779,381 B2  8/2010  Chickermane et al.
7,877,715 B1 * 1/2011  Thirunavukarasu .........
                                          G01R 31/318533
                                                         716/136

(Continued)

OTHER PUBLICATIONS

F. Hapke et al., "Defect-oriented cell-aware ATPG and fault simulation for industrial cell libraries and designs," 2009 International Test Conference, Austin, TX, USA, 2009, pp. 1-10, doi: 10.1109/TEST.2009.5355741.
Lin, et al. "Timing-Aware ATPG for High Quality At-speed Testing of Small Delay Defects" Dec. 2006 Proceedings of the Asian Test Symposium 2006:139-146.
Mattiuzzo, et al. "SDD automatic test-pattern generation breaks the nanometer quality barrier", Test & Measurement World, Jun. 2009.

(Continued)

*Primary Examiner* — Binh C Tat
(74) *Attorney, Agent, or Firm* — Tarolli, Sundheim, Covell & Tummino LLP

(57) ABSTRACT

A fault rules engine generates a plurality of fault rules files. Each of the fault rules files is associated with a respective cell type of a plurality of cell types in an integrated circuit (IC) design, and each fault rules file of the plurality of fault rules files can include data quantifying a nominal delay for a given two-cycle test pattern of a set of two-cycle test patterns and data quantifying a delta delay for the given two-cycle test pattern corresponding to a given candidate defect of a plurality of candidate defects for a given cell type in the IC design. An IC test engine generates cell-aware test patterns based on the plurality of fault rules files to test a fabricated IC chip that is based on the IC design for defects corresponding to a subset of the plurality of candidate defects characterized in the plurality of fault rules files.

17 Claims, 8 Drawing Sheets

(58) Field of Classification Search
CPC .......... H01L 27/11206; H01L 27/1128; H01L 2924/00; H01L 2924/00014; H01L 2924/1305; G01R 31/31835; G01R 31/2846; G01R 31/01; G01R 31/2853; G01R 31/2894; G01R 31/31704; G01R 31/3008
USPC .............................................. 716/110–117
See application file for complete search history.

(56) References Cited

U.S. PATENT DOCUMENTS

| | | | |
|---|---|---|---|
| 7,925,941 | B2 | 4/2011 | Bhatia |
| 8,875,077 | B1 | 10/2014 | O'Riordan et al. |
| 10,528,692 | B1 | 1/2020 | Guo et al. |
| 2018/0024192 | A1* | 1/2018 | Sinha ............... G01R 31/31703 714/738 |
| 2020/0410065 | A1* | 12/2020 | Cheng ................... G06F 30/30 |

OTHER PUBLICATIONS

S. Ho et al., "Automatic test pattern generation for delay defects using timed characteristic functions," 2013 IEEE/ACM International Conference on Computer-Aided Design (ICCAD), San Jose, CA, USA, 2013, pp. 91-98, doi: 10.1109/ICCAD.2013.6691103.
Sherubha, et al. "Test pattern generation for longest path eliminating SDD using ATPG", International Journal of Engineering Research and Technology(IJERT), ICSEM-2013 Conference Proceedings.
Z. Gao, S. Malagi, E. J. Marinissen, J. Swenton, J. Huisken and K. Goossens, "Defect-Location Identification for Cell-Aware Test," 2019 IEEE Latin American Test Symposium (LATS), Santiago, Chile, 2019, pp. 1-6, doi: 10.1109/LATW.2019.8704561.

* cited by examiner

FIG. 4

FAULT RULES FILES FOR TESTING AN IC CHIP

TECHNICAL FIELD

This disclosure relates to testing integrated circuit (IC) chips. More particularly, this disclosure relates to generating a fault rules file to facilitate testing of an IC chip.

BACKGROUND

As IC chip complexity increases, meeting the testing requirements for acceptable quality assurance is becoming increasingly difficult. Automated testing involves applying test signals to each manufactured circuit in various patterns designed to detect defects that cause improper circuit behavior. Although most modern integrated circuits comprise a number of interconnected cells selected from a library, early testing schemes assumed that faults occurred only between cell instances, at the cell I/O ports, or elsewhere outside cells altogether. The test patterns generated therefore did not necessarily include those needed to detect circuit faults inside a cell.

ATPG (acronym for both Automatic Test Pattern Generation and Automatic Test Pattern Generator) is an electronic design automation method/technology used to find an input (or test) sequence that, when applied to a digital circuit, enables automatic test equipment to distinguish between the correct circuit behavior and the faulty circuit behavior caused by defects. The generated patterns are used to test semiconductor devices after manufacture, or to assist with determining the cause of failure. The effectiveness of ATPG systems is measured by the number of modeled defects, or fault models, detectable and by the number of generated patterns. These metrics generally indicate test quality (higher with more fault detections) and test application time (higher with more patterns). ATPG efficiency is another consideration that is influenced by the fault model under consideration, the type of circuit under test (full scan, synchronous sequential, or asynchronous sequential), the level of abstraction used to represent the circuit under test (gate, register-transfer, switch), and the required test quality.

A defect is an error caused in a device during the manufacturing process. A fault model is a mathematical description of how a defect alters design behavior. The logic values observed at the device's primary outputs, while applying a test pattern to some device under test (DUT), are called the output of that test pattern. The output of a test pattern, when testing a fault-free device that works exactly as designed, is called the expected output of that test pattern. A fault is said to be detected by a test pattern if the output of that test pattern, when testing a device that has only that one fault, is different than the expected output. The ATPG process for a targeted fault has two phases: fault activation and fault propagation. Fault activation establishes a signal value at the fault model site that is opposite of the value produced by the fault model. Fault propagation moves the resulting signal value, or fault effect, forward by sensitizing a path from the fault site to a primary output.

A standard cell is a group of transistor and interconnect structures that provides a Boolean logic function (e.g., AND, OR, NOR, NAND, XOR, XNOR, inverters) or a storage function (flipflop or latch). The simplest cells are direct representations of the elemental NAND, NOR, and XOR Boolean function, although cells of much greater complexity are commonly used (such as a 2-bit full-adder, or muxed D-input flipflop.) The cell's Boolean logic function is called its logical view: functional behavior is captured in the form of a truth table or Boolean algebra equation (for combinational logic), or a state transition table (for sequential logic).

As IC chips continue move to smaller geometries and complex components, the existing fault models and test patterns are becoming less effective at ensuring required levels of quality. Concurrently, a growing number of IC chips for certain environments of application is pushing the demand for zero-defect silicon. The main problem with conventional fault models is that conventional fault models only consider faults on cell inputs and outputs and on interconnect lines between these cells. In other words, only faults abstracted to the netlist level are explicitly considered. Cell-aware test overcomes the limitations of conventional fault models and associated test patterns by targeting specific shorts, opens, and transistor defects internal to each standard cell.

SUMMARY

One example relates to a non-transitory machine-readable medium having machine-readable instructions. The machine-readable instructions can include a fault rules engine that generates a plurality of fault rules files. Each of the fault rules files is associated with a respective cell type of a plurality of cell types in an integrated circuit (IC) design, and each fault rules file of the plurality of fault rules files comprises data quantifying a nominal delay for a given two-cycle test pattern of a set of two-cycle test patterns and data quantifying a delta delay for the given two-cycle test pattern corresponding to a given candidate defect of a plurality of candidate defects for a given cell type of the plurality of cell types in the IC design. The machine-readable instructions also include an IC test engine that generates cell-aware test patterns based on the plurality of fault rules files to test a fabricated IC chip that is based on the IC design for defects corresponding to a subset of the plurality of candidate defects characterized in the plurality of fault rules files.

Another example relates to a system that can include a non-transitory memory that stores machine-readable instructions and a processing unit that accesses the memory and executes the machine-readable instructions. The machine-readable instructions can include an IC test engine that employs untimed ATPG techniques to generate cell-aware test patterns based on a plurality of fault rules files to test a fabricated IC chip for defects corresponding to a subset of a plurality of candidate defects characterized in the plurality of fault rules files. Each of the fault rules files is associated with a respective cell type of a plurality of cell types in an IC design of the fabricated IC chip, and each fault rules file of the plurality of fault rules files comprises data quantifying a nominal delay for a given two-cycle test pattern of a set of two-cycle test patterns and data quantifying a delta delay for the given two-cycle test pattern corresponding to a given candidate defect of a plurality of candidate defects in the IC design.

Yet another example relates to a method for generating a fault rule file for testing a fabricated IC chip. The method can include generating, by a fault rules engine operating on a computing platform, a netlist characterizing a selected cell type of a plurality of cell types included in an integrated circuit (IC) design for the IC chip, wherein the netlist identifies parasitic components that have a potential of causing a defect in the fabricated IC chip. The method can also include generating, by the fault rules engine, a plurality of candidate defects for the selected cell type, wherein each candidate defect corresponds to a given parasitic component of the parasitic components identified in the netlist, transistor terminals or to a defect location identified by the fault rules engine. The method can further include analyzing, by the fault rules engine, each candidate defect with a set of two-cycle test patterns to determine an impact of the candidate defect on the selected cell to generate a fault rules file for the selected cell type, wherein the fault rules file includes data quantifying a nominal delay for a particular two-cycle test pattern of the set of two-cycle test patterns and data quantifying a delta delay for the particular two-cycle test pattern corresponding to a particular candidate defect of the plurality of candidate defects.

BRIEF DESCRIPTION OF THE DRAWINGS

FIG. 4 illustrates an example of a defect detection matrix (DDM) for a cell.

DETAILED DESCRIPTION

This disclosure relates to a system for employing untimed ATPG techniques to generate "cell-aware" test patterns for an IC chip test. A cell-aware test pattern targets candidate defects inside a given library cell, typically those defects that have been extracted from the actual circuit design layout. Such defects can be physically correlated to actual observed fabrication errors, and are therefore of particular interest. For instance, bridge defects that can cause an unintended short or low-resistance connection, and open defects that can cause an unintended disconnection, for example are typically of highest interest.

The system can include a fault rules engine that generates a plurality of fault rules files for an IC design. Each of the fault rules files is associated with a respective cell type of a plurality of cell types in the IC design. Moreover, each fault rules file includes data (e.g., integers or floating points) quantifying a nominal delay for a given two-cycle test pattern of a set of two-cycle test patterns and data (e.g., integers or floating points) quantifying a delta delay for the given two-cycle test pattern corresponding to a given candidate defect of a plurality of candidate defects in the IC design. Additionally, the nominal delay and the delay of some (or all) of the fault rules files are based on an input slew rate and an output load provided in IC data for each cell type of the plurality of cell types, or some subset thereof. The IC data can be selected, for example based on an environment of application an IC chip implementing the IC design.

The fault rules files are consumable by an IC test engine to generate cell-aware test patterns to test a fabricated IC chip that is based on the IC design. The IC test engine generates the cell-aware test patterns to test the fabricated IC chip for defects corresponding to a subset of the plurality of candidate defects characterized in the plurality of fault rules files. The cell-aware test patterns are based on the plurality of fault rules files. Additionally, the IC data can include information characterizing a minimum defect delay size, a maximum defect delay size or a range of defect delay sizes for a fabricated IC chip corresponding to the IC design. The IC data can be employed, for example to adjust the set of testing patterns employed to test the fabricated IC chip. By employing the fault rules engine and the IC test engine described herein, a relatively efficient and accurate process of testing IC chips employing cell-aware test patterns can be realized.

Figure 1:
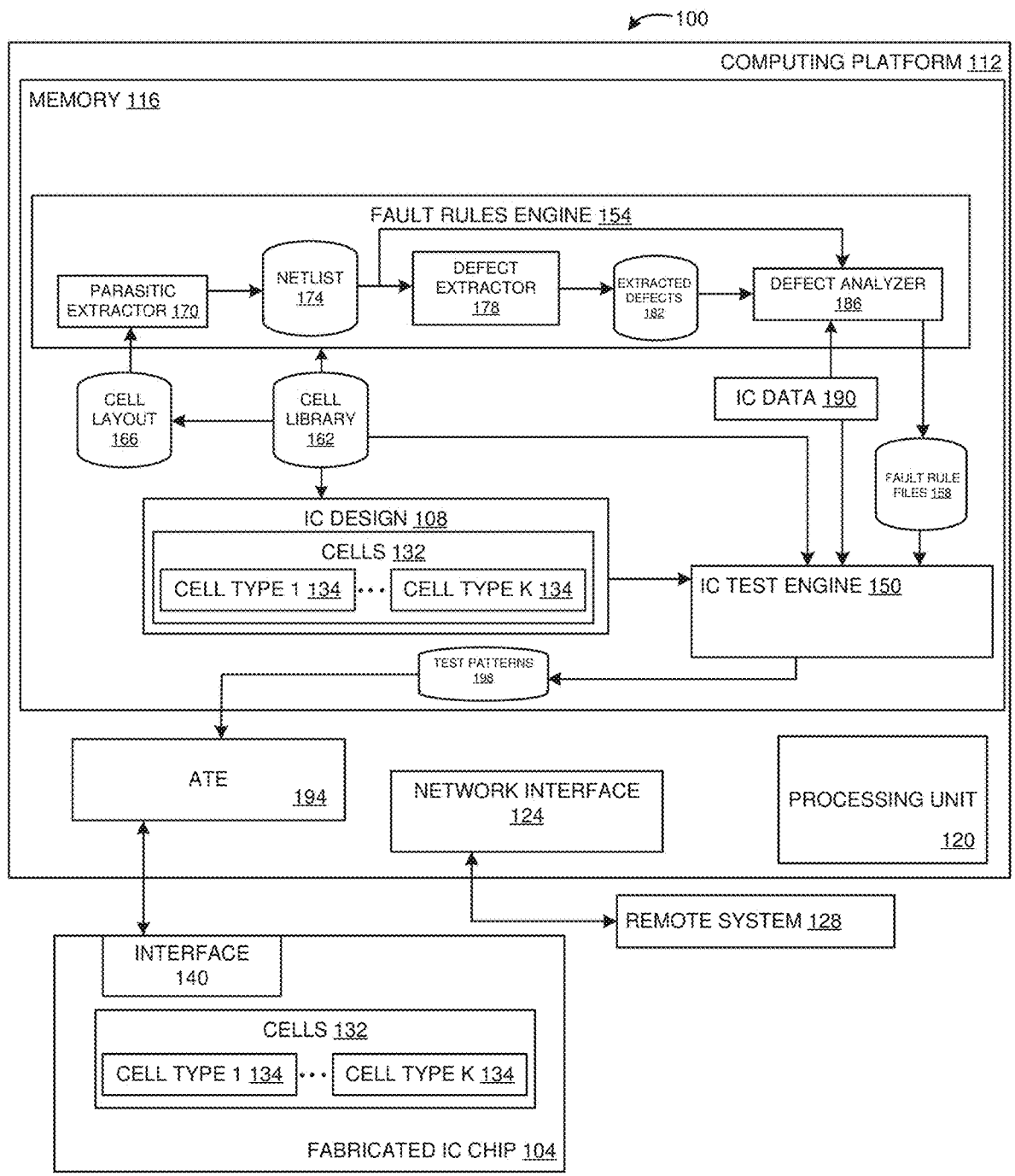
FIG. 1 illustrates an example of a system for testing a fabricated IC chip that is based on an IC design.

FIG. 1 illustrates an example of a system 100 for testing a fabricated IC chip 104 that is based on an IC design 108. The system 100 can include a computing platform 112. Accordingly, the computing platform 112 can include a memory 116 for storing machined readable instructions and data and a processing unit 120 for accessing the memory 116 and executing the machine-readable instructions. The memory 116 represents a non-transitory machine-readable memory (or other medium), such as random access memory (RAM), a solid state drive, a hard disk drive or a combination thereof. The processing unit 120 can be implemented as one or more processor cores. The computing platform 112 can include a network interface 124 (e.g., a network interface card) configured to communicate with other computing platforms via a network, such as a public network (e.g., the Internet), a private network (e.g., a local area network (LAN)) or a combination thereof (e.g., a virtual private network).

The computing platform 112 could be implemented in a computing cloud. In such a situation, features of the computing platform 112, such as the processing unit 120, the network interface 124, and the memory 116 could be representative of a single instance of hardware or multiple instances of hardware with applications executing across the multiple of instances (i.e., distributed) of hardware (e.g., computers, routers, memory, processors, or a combination thereof). Alternatively, the computing platform 112 could be implemented on a single dedicated server or workstation.

The IC design 108 can be stored in the memory 116 of the computing platform 112. The IC design 108 can be implemented, for example, as design specifications for an IC chip. The IC design 108 can be generated with an electronic design automation (EDA) application operating on a remote system 128, such as a logic synthesis application (e.g., a synthesis tool). For instance, an end-user of the EDA application can employ a user-interface to generate and/or modify hardware description language (HDL) code (e.g., Verilog) for generating a register-transfer level (RTL) model (e.g., RTL code) characterizing a circuit, wherein the RTL model is transformable by an EDA application into a physically realizable gate-level netlist for the IC design 108.

As noted, in the examples described, the fabricated IC chip 104 represents a physically instantiated version of the IC design 108. More particularly, the fabricated IC chip 104 and the IC design 108 can include intellectual property (IP) blocks formed of cells 132. Each cell 132 (alternatively referred to as standard cells), can represent a group of transistor and interconnect structures that provides a Boolean logic function (e.g., AND, OR, NOR, NAND, XOR, XNOR, inverters) or a storage function (e.g., flipflop or latch). The cells 132 of the fabricated IC chip 104 represent physically instantiated versions of the cells 132 of the IC design 108. Thus, the cells 132 of the IC design 108 and the cells 132 of the fabricated IC chip 104 employ the same reference numbers. In many instances, there can be virtually any number of cells 132 (e.g., hundreds, thousands or millions). In the present example, there are K number of different cell types 134 of the cells 132, where K is an integer greater than or equal to one.

The fabricated IC chip 104 can include an interface 140 that enables external systems to provide stimuli to the components of the fabricated IC chip 104, including the cells 132 of the fabricated IC chip 104. The interface 140 can conform to the standards set forth in the IEEE 1149.1 standards, IEEE 1149.6 standards, or can be implemented with PCI, wafer probes etc.

The memory 116 includes an IC test engine 150 which can be implemented as application software or a software module. The IC test engine 150 is configured to generate and execute employ untimed ATPG techniques to generate a test pattern that can be applied to the fabricated IC chip 104 to ensure proper operation.

The IC test engine 150 can operate in concert with a fault rules engine 154 stored in the memory 116. The fault rules engine 154 can be configured/programmed to generate fault rules files 158. In some examples, the fault rules engine 154 generates Defect Detection Matrices (DDMs) that each represents a user-readable format of a corresponding fault rules file 158. Each fault rule file 158 represents a set of fault rules for a particular cell type 134 of the K number of cell types 134 that is selected from a cell library 162. The cell library 162 can include, but is not limited to, data characterizing a physical layout of each of the K number of cell types 134 in the cells 132 of the IC design 108 and the fabricated IC chip 104. The cell library 162 can also include structural Verilog (.v), behavioral Verilog (.v) and timing models (.lib).

To generate the fault rule files 158, the fault rules engine 154 can read a cell layout 166 from the cell library 162. The cell layout 166 corresponds to a physical layout view of the standard cell type 134 in terms of mask polygons containing the geometrical data required to fabricate the IC chip 104. The fault rules engine 154 generates a particular fault rule file 158 of the fault rule files 158 based on the cell identified in the cell layout 166.

The fault rules engine 154 can represent a plurality of software applications that operate in an ordered sequence to generate each instance of the fault rule files 158. In particular, the cell layout 166 can be received by a parasitic extractor 170. The parasitic extractor 170 generates a transistor-level netlist 174 of the cell represented by the cell layout 166. The parasitic extractor 170 utilizes the layout information of the cell layout 166, along with other fabrication technology related information available in the cell library 162 to generate the transistor level netlist 174. The netlist 174 is a textual description of the standard cell type 134 in terms of its designed devices (i.e. transistors), input output pins and their inter-connections. The netlist 174 also includes un-avoidable parasitic resistors (Rs) and capacitors (Cs) inherent to a standard cell type 134 extracted by the parasitic extractor 170. The parasitic resistors for example can be extracted on the wires and inter-connects and for the terminals of a transistor e.g. drain, gate, source, bulk. The parasitic extractor 170 can extract parasitic capacitors between wires on the same layer (intra-layer), between layers (inter-layer) or across transistor terminals e.g. drain-gate, drain-source, bulk-drain etc. The netlist 174 can be provided in the Detailed Standard Parasitic Format (DSPF).

The fault rules engine 154 can include a defect extractor 178 that can analyze the netlist 174 to identify parasitic resistors and capacitors to be modeled as potential open and short defects for the standard cell type 134 to provide extracted defects 182. The extracted defects 182 can include data for modeling each of the defects identified in the netlist 174. For instance, a large parasitic resistor indicates a long and thin wire segment which can undergo an unintended break, and hence is a potential 'open' defect site. A large parasitic capacitance between two nets or wire segments indicates that the two nets or wires are very close to each other and hence can be potentially shorted. An open defect is modeled with a high ohmic resistance (e.g. 1 G Ohm), and a short is modeled with a very low resistance (e.g., 0.001 Ohm).

The extracted defects 182 and the identified defects in the netlist 174 can be provided to a defect analyzer 186 that characterizes each of the defects in the netlist 174 based on the extracted defects 182. More particularly, the defect analyzer 186 simulates operation of a circuit representing the cell layout 166 for each instance of the extracted defects 182. For example, the defect analyzer 186 can simulate operation of the circuit representing a particular cell with each parasitic capacitor and/or resistor being set to a defect free value, and open or a short. The defect analyzer 186 can identify transition defects as well as static defects in one of the K number of cell types 134 characterized by the cell layout 166. Transition defects characterize defects wherein a component within the cell reaches an expected value slower than is acceptable. Conversely, static defects refer to defects that cause a circuit component to not reach an expected value within the typically used tester cycle period (e.g. 20 ns for a 50 MHz tester cycle). Throughout this disclosure, unless otherwise noted the defects analyzed by the defect analyzer 186 referred to a combination of transition defects and static defects.

The defect analyzer 186 outputs an instance of the fault rule file 158 based on the results of the analysis. The fault rules file 158 can include data that quantifies a nominal delay for the particular cell and a delta delay caused by each defect analyzed. The fault rules engine 154 can repeat operations iteratively generate the fault rules files 158 for each cell type 134 in the K number of cell types 134.

Additionally, IC data 190 characterizing selectable attributes of the IC design 108 can be provided to the defect analyzer 186. In some examples, the IC data 190 can be provided, in response to user input. For instance, the IC data 190 can be generated during or after the IC design 108 is being generated. The IC data 190 can include information for each type of cell included in the IC design 108, or some subset thereof. This information can include, for example, an input slew rate and an output load for each of the K number of cell types 134 in the cells 132. The input slew rate and output load can be based, for example, on a-priori knowledge of delay paths in the IC design 108. Moreover, as noted, there can be multiple instantiations of each of the K number of cell types 134 of the cells 132 that each have different path delays. In these situations, one input slew rate and output load is provided for each of the K number of cell types 134 of the cells 132 or some subset thereof. In some examples, the input slew rate and output load can be based on an average path delay of each of the K number of cell types 134 of the cells 132. In some examples, the input slew rate and/or output load for a subset of the K number of cell types 134 may be omitted. In such a situation, the IC test engine 150 can select a default input slew rate and/or a default output load for the subset of the K number of cell types 134.

The defect analyzer 186 of the fault rules engine can tune the fault rules files 158 for each of the plurality of cell types 134, or some subset thereof, based on the input slew rate and output load of each of the K number of cell types 134 of the cells 132 (specified in the IC data 190). More particularly, the defect analyzer 186 can be employed to tune a nominal delay and a defect delay for the fault rules files of each of the K number of cell types 134, or some subset thereof.

Figure 2:
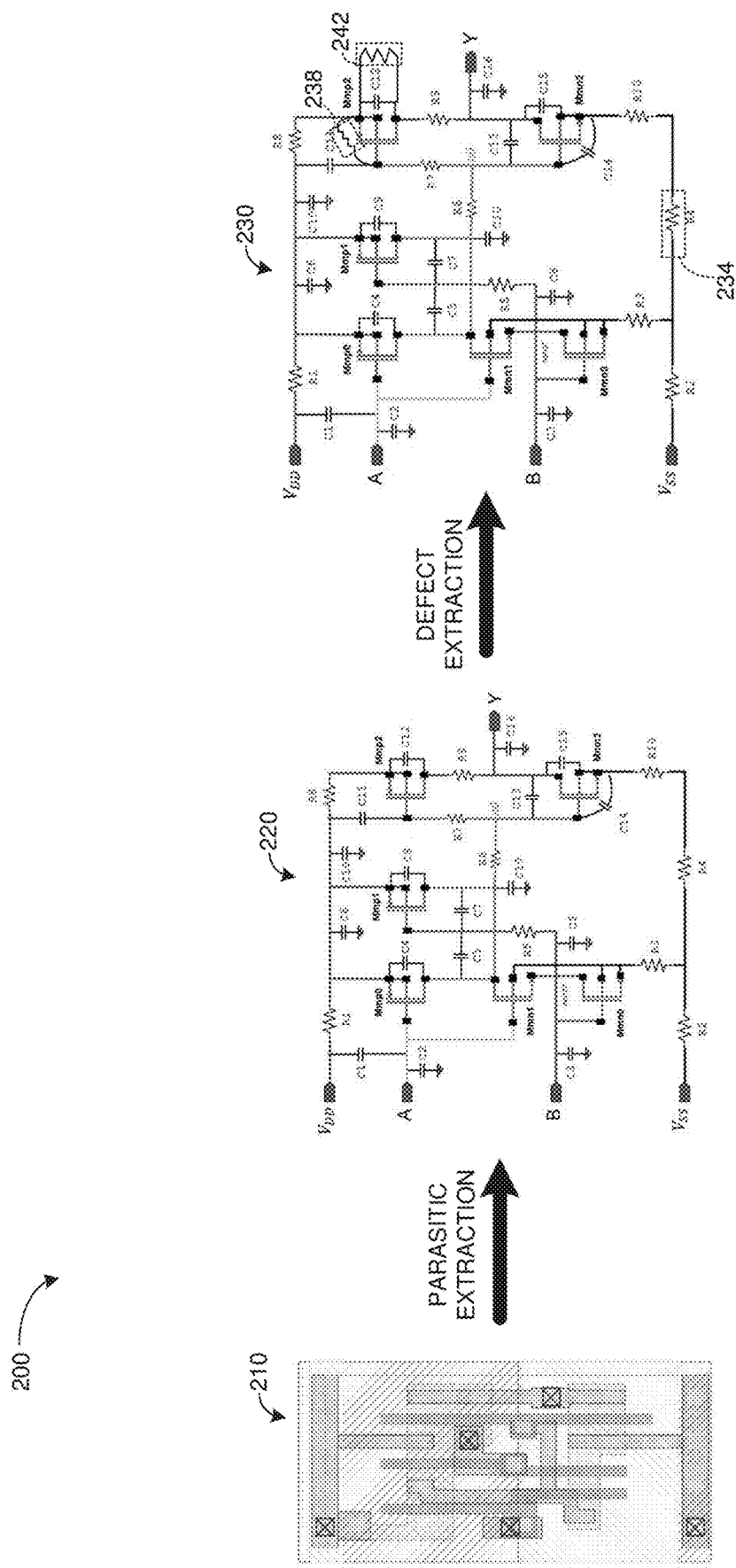
FIG. 2 illustrates diagrams depicting a flow for extracting defects in a cell.
Figure 4:
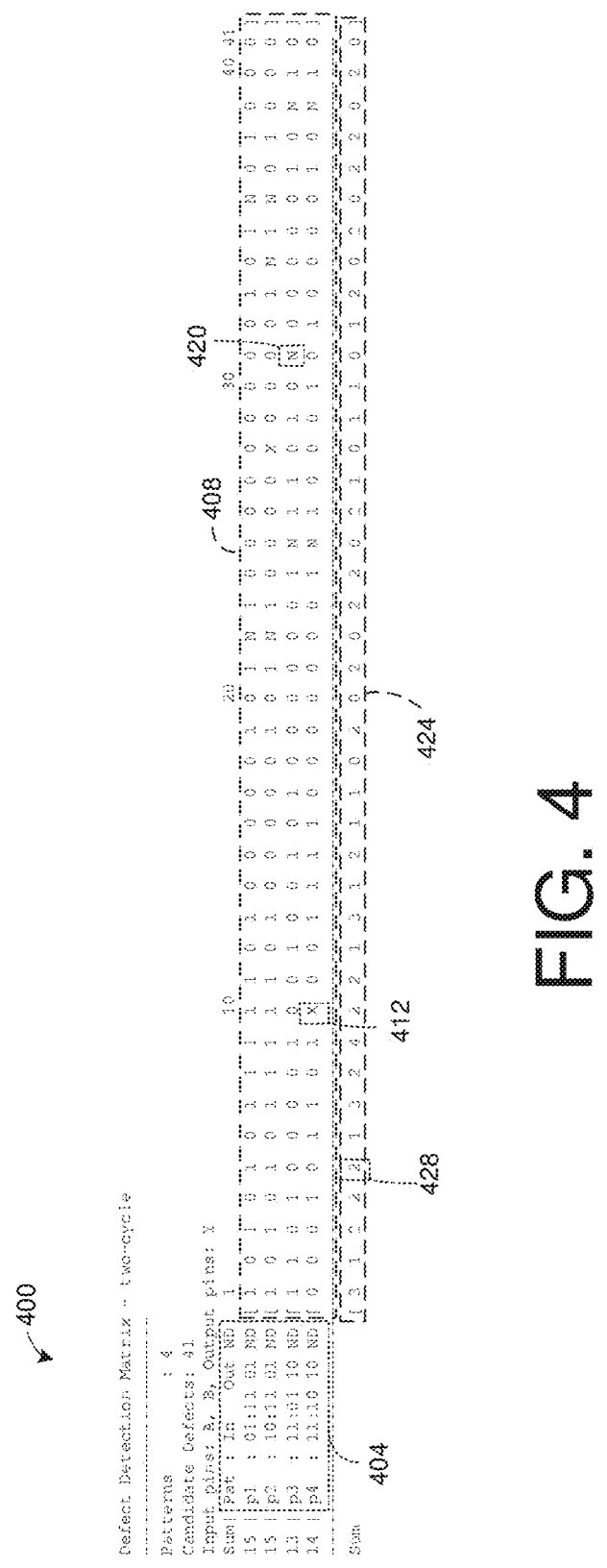

To facilitate understanding of the operations of the fault rules engine 154, a given extended example ("the given example") is provided and explained with respect to FIGS. 2-4. The given example illustrates and describes how a fault rules file for a cell with an AND gate can be generated.

FIG. 2 includes diagrams depicting a flow 200 for extracting potential defects in a cell in the given example. FIG. 2 includes a cell layout 210 for an AND gate. The physical cell layout 210 characterizes the physical layout of an IC chip that physically instantiates the AND gate. More particularly, the physical cell layout 210 includes connection points and traces that form the AND gate.

A parasitic extractor, such as the parasitic extractor 170 of FIG. 1 can analyze the physical cell layout 210 to generate a transistor-level netlist of the cell layout 210. The transistor-level netlist provides data sufficient to generate a circuit diagram 220 for the physical cell layout 210. The parasitic extractor analyzes the netlist to identify and extract parasitic components in the cell represented by the circuit diagram 220. These parasitic components include parasitic resistors and capacitors that are not intended by the designer of the cell, but exist in a fabricated IC chip that employs the cell. Parasitic capacitance, or stray capacitance is an unavoidable (and usually unwanted) capacitance that exists because of proximity of circuit components, such as wires, interconnects between transistor terminals, etc. Similarly, all conductors (e.g. wires, interconnects) in the cell layout 210 possess some unavoidable parasitic resistance. The parasitic extractor extracts (or models) these parasitic resistors and capacitors in the circuit diagram 220. In this manner, the parasitic extractor generates an accurate analog model of for the physical cell layout 210 that is characterized in the circuit diagram 220, which analog model is employable to emulate circuit responses in detailed simulations of the circuit diagram 220.

In some examples, parasitic resistors and/or capacitors are present between nodes of the transistor. For example, a circuit diagram may have a parasitic capacitor between a drain and a gate, the drain and a source, the drain and a bulk. Additionally or alternatively a circuit diagram may have a parasitic capacitor between the gate and the source, the bulk and the source or the bulk and the gate.

The parasitic extractor identifies (marks) node in the netlist with the parasitic components that could lead to defects. Thus, the parasitic extractor augments the netlist with data that includes the identification of parasitics extracted from the netlist. In the given example, the parasitic extractor analyzes the circuit diagram 220 to provide a circuit diagram 230 that includes specific identification of a resistor R4 234 in the netlist as a parasitic component.

The netlist in DSPF that identifies parasitics with the greatest potential for causing a defect can be provided to a defect extractor, such as the defect extractor 178 of FIG. 1. The defect extractor employs the parasitics identified in the netlist to model potential open and short defects within a standard cell. More particularly, the defect extractor can analyze the identified parasitics and generate a fault model for each identified parasitic in the netlist, or some subset thereof. Additionally, the defect extractor searches the circuit diagram 220 to identify nets that are relatively long which could form a parasitic resistor and/or nets that are relatively close and running parallel over long distance, which could form a parasitic capacitor. These parasitic capacitors have a high probability of corresponding to probable short locations as a result of defects induced during fabrication. That is, the defect extractor can identify locations in the netlist that have a higher probability of corresponding to manufacturing defects.

The fault model for each parasitic resistor can represent an instance of a circuit design wherein a respective parasitic resistor is modeled as an open (e.g. a resistor with a resistance of 1 G Ohm). Examples of such modeled opens can include, but are not limited to opens at a drain, gate, source and bulk terminals on FETs, and opens on each branch of interconnected nets including signaling nets and between power-ground nets. Additionally, the fault model for each parasitic capacitor can be represented as an instance of the circuit design wherein a respective parasitic capacitor is modeled as a short (e.g., a resistor with a resistance of 0.001 Ohm). The examples of such modeled shorts can include, but are not limited to shorts across FET terminal pairs, including drain-source, drain-gate, source-gate, bulk-drain, bulk-gate and bulk-source pairs. The examples of such model shorts also include shorts across each possible interconnected net pairs, signal nets on the same layer (e.g., intralayer shorts), shorts between power-ground nets (e.g., power-ground shorts) and shorts between adjacent layers (e.g., inter-layer shorts). The defect extractor can provide extracted defects, such as the extracted defects 182 of FIG. 1 that identifies the location of defects modeled by the defect extractor. In the given example, the resistor R4 234 can be modeled as an open circuit in one fault model of the circuit design. In another fault model of the circuit design, or the transistor terminals of MMP2 238 or the capacitor C12 242 can be modeled as a short. That is, the defect extractor generates multiple versions of a circuit representing a cell, wherein each version (a fault model) includes an open or a short replacing a particular parasitic resistor or parasitic capacitor. Each of the fault models can be aggregated into the extracted defects that can be provided to a defect analyzer, such as the defect analyzer 186 of FIG. 1.

The defect analyzer can employ the extracted defects characterized with fault models to generate a DDM and a fault rule file that characterizes a detectability of each fault identified in the netlist, or some subset thereof. More particularly, the defect analyzer can employ transient fault analysis to generate the DDM and the fault rule file for the cell. In the given example, it is presumed that there are 41 potential faults. The defect analyze applies a set of two-cycle test patterns for each potential fault to determine whether a fault is detectable, and if the fault is detectable, to determine if the fault is a static fault or a transient fault. Moreover, if the fault is a transient fault, the defect analyzer identifies a defect delay percentage that represents a deviation from a nominal delay characterized by a defect-free version of a cell.

In the given example, the circuit diagram 220 includes input nodes labeled A and B and an output node labeled Y. As noted, in the given example the cell represents an AND gate. Thus, an instance of the cell with no defects should provide an output of a logical one on node Y if, and only if nodes A and B have a logical one applied there on. Additionally, node Y should output a logical 0 for all other combinations of logical values applied to nodes A and B. To generate the DDM and the fault rule file, the defect analyzer simulates instantiations of the cell that have particular defects and analyzes whether a particular defect impacts an output of a cell based on the application of two-cycle test patterns applied to the input nodes (nodes A and B in the given example).

Figure 3A:
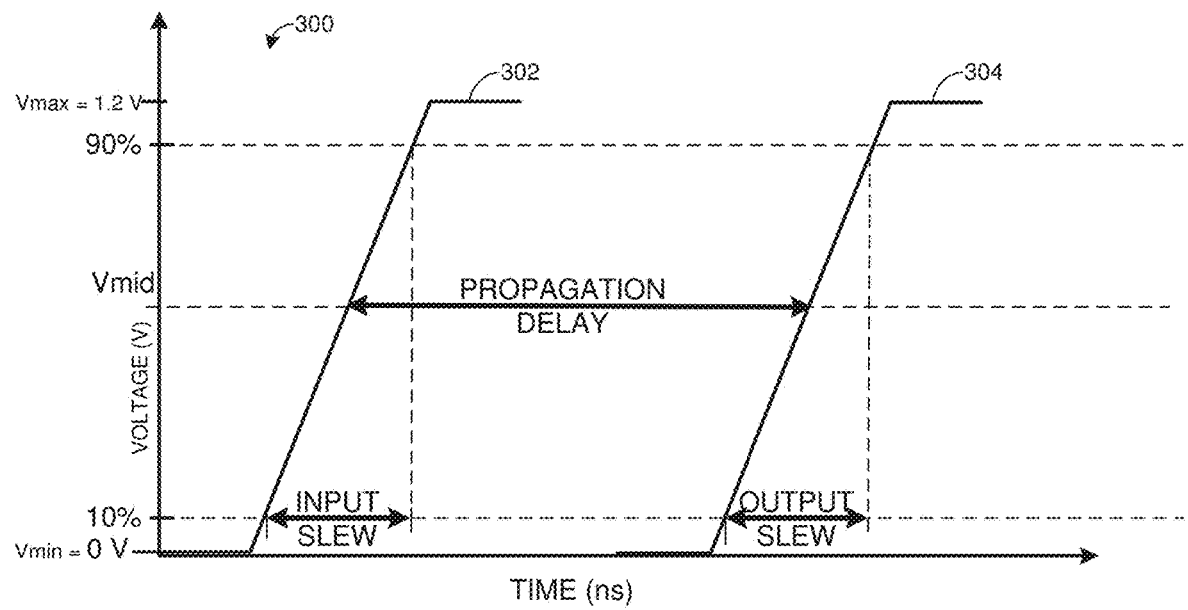
FIG. 3A illustrates a timing diagram depicting a measurement of propagation delay in a cell.

FIG. 3A illustrates a timing diagram 300 that demonstrates a measurement of propagation delay for a cell, such as the AND gate in the given example. The timing diagram 300 plots an input signal 302 and an output signal 304 for the cell. The input signal can represent a signal of a test pattern at an input node of the cell, and the output signal 304 can represent the response to the test pattern. The timing diagram 300 plots voltage (V) as a function of time in nanoseconds (ns). In the timing diagram 300, it is presumed that a voltage of 1.2 V coincides with Vmax and 0 V coincides with Vmin. Therefore, the midpoint voltage of Vmid is 0.6 V. In other examples, the value of Vmax may be different for various technologies such that Vmid would change accordingly.

As noted, IC data, such as the IC data 190 of FIG. 1 includes an input slew rate and an output load for each cell type 134 or some subset thereof. In such a situation, the output load for a given cell type can be employed to calculate an output slew. The input slew provided in the IC data defines a time interval during a rising edge (or falling edge, in other examples) of the input signal 302 where the input signal 302 transitions from 10% of Vmax (0.12 V) and 90% of Vmax (1.08 V). Similarly, the output slew (calculated from the output load) defines a time interval during a rising edge (or falling edge, in other examples) of the output signal 304 where the output signal transitions from 10% of Vmax (0.12 V) and 90% of Vmax (1.08 V). Moreover, the propagation delay for the cell is a time interval between a time that the input signal 302 crosses the midpoint voltage, Vmid, and a time that the output signal 304 crosses the midpoint voltage, Vmid.

Figure 3B:
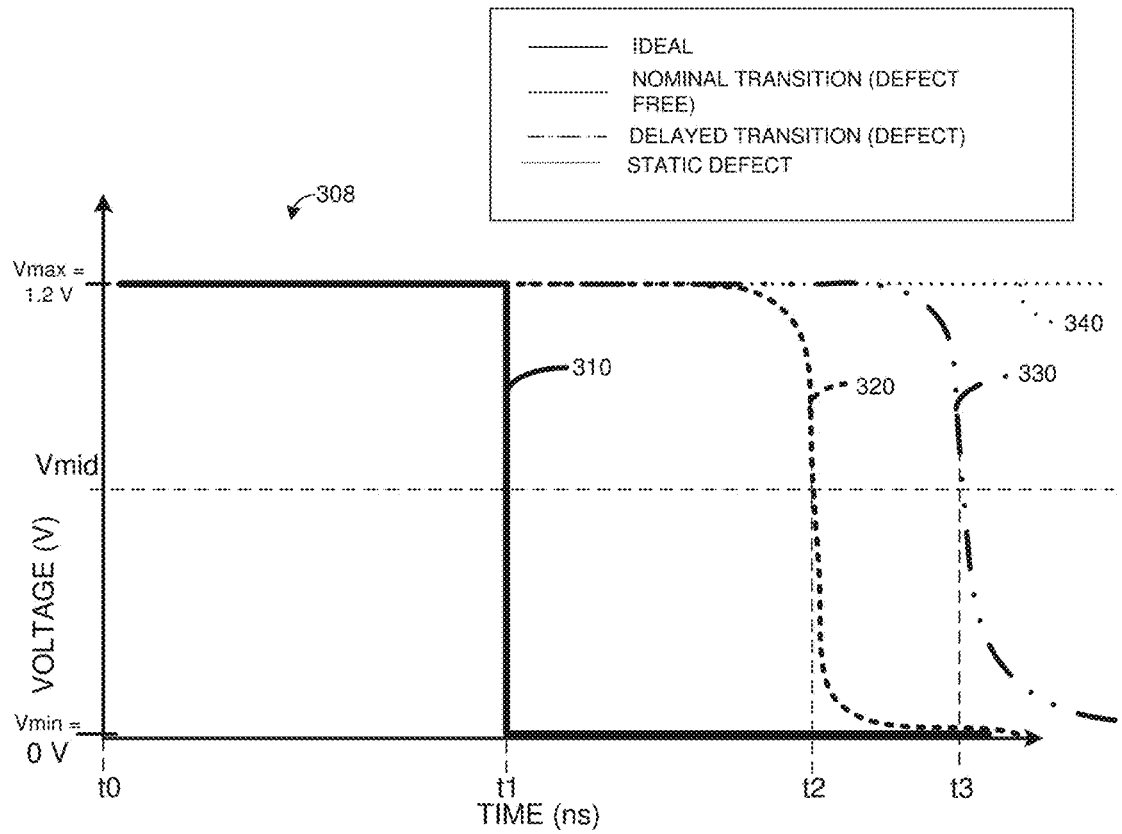
FIG. 3B illustrates a timing diagram depicting application of a two-cycle test pattern for a cell.

FIG. 3B illustrates a timing diagram 308 depicting application of a two-cycle test pattern for a cell. Similar to FIG. 3A, the timing diagram plots voltage (V) as a function of time in nanoseconds (ns). The defect analyzer employs the two-cycle test pattern to measure a response (output) to two different test patterns, namely a first test pattern and a second test pattern, as well as a time delay for a change in the response.

Continuing with the given example a first plot 310 of the timing diagram 300 plots the response of an ideal circuit representing the circuit diagram 220 for a cell of FIG. 2. In the ideal circuit, the output node, Y changes instantaneously in response to a change in a signal at the input nodes, A and B. A second plot 320 of the timing diagram 300 plots a simulated response of a defect free version of the circuit representing the circuit diagram 220 for a cell of FIG. 2. A third plot 330 of the timing diagram 300 plots a simulated response of the circuit diagram 230 for a cell of FIG. 2 wherein a fault model is applied, such that the circuit includes a candidate defect that causes a transition delay. A fourth plot 340 of the timing diagram 300 plots a simulated response of the circuit diagram 230 of FIG. 2 wherein another fault model is applied that causes a static defect. For purposes of simplification of explanation, it is presumed that the third plot 330 represents the circuit diagram 230 for a cell where the parasitic resistor R3 234 is modeled as an open, and the fourth plot 340 represents the circuit diagram 230 where the parasitic capacitor C12 242 is modeled as a short.

In the given example, it is presumed that from time t0 to time t1 (e.g., a time interval of about 500 ps which can be defined with the IC data) that a first test pattern of the two-cycle test pattern applies a logical 1 to node A, a logical 1 to node B, such that the expected (defect free) response is an output of a logical 1 on node Y. Additionally, in the given example, it is presumed that from time t1 onward that a second, test pattern of the two-cycle test applies a logical 0 to node A and a logical 1 to node B, such that the expected (defect free) response is an output of a logical 0 on node Y.

Similar to the timing diagram 300, in the timing diagram 308, it is presumed that a voltage of 1.2 V coincides with Vmax and 0 V coincides with Vmin. Therefore, the midpoint voltage of Vmid is 0.6 V. In other examples, the value of Vmax may be different for various technologies such that Vmid would change accordingly. Accordingly, during the time interval between t0 and t1, the first plot 310 representing the ideal circuit version of the cell, the second plot 320 representing a defect-free version of the cell and the third plot 330 representing a version of the cell with a candidate defect causing a delayed transition (specifically, modeling resistor R4 234 as an open), each plots provides a voltage above the midpoint voltage, Vmid (e.g., a voltage of about 1.2 V), such that the first plot 310, the second plot 320 and the third plot 330 each represent the output node, Y outputting a logical 1 in the given example. Conversely, the fourth plot 340 representing the cell with the parasitic capacitor C12 242 is modeled as a short outputs a voltage below the midpoint voltage, Vmid (e.g., a voltage of about 0 V) such that the fourth plot 340 represents the output node, Y outputting a logical 1.

In the timing diagram 300, as noted, from time t1 onward, it is presumed that the second test pattern is applied. As illustrated, at time t1, the first plot 310 representing an ideal circuit version of the cell instantaneously reduces to 0.1 V, thereby representing a logical 0 on the output node, Y in the given example. Additionally, the second plot 320 representing a defect free version of the cell, transitions from 1.2 V to the midpoint voltage, Vmid from time t1 until a time t2. The third plot 330 representing the cell with a candidate defect causing a transition delay, transitions from 1.2 V to the midpoint voltage, Vmid from time t1 until time t3 (wherein t3 is later than t2). Moreover, the fourth plot 340, representing the cell with a static defect remains constant at 1.2 V and does not respond to the change in the test pattern. Thus, the defect analyzer can record the candidate defect modeled by the fourth plot 340 as a static fault.

The time interval between times t1 and t2 corresponds to the propagation delay in the timing diagram 300. That is, the time interval between times t1 and t2 corresponds to a time interval between a time that an input signal crossed the midpoint voltage, Vmid and an output signal (e.g., the second plot 320 representing the defect free version of the cell) crosses the midpoint voltage, Vmid in response to the change at the input signal. The defect analyzer measures and records this time interval as nominal delay, $Delay_{nom}$ for the cell for the two-cycle test pattern applied. Similarly, the time interval between times t1 and t3 corresponds to a time interval between a time that the input signal crossed the midpoint voltage, Vmid and the output signal (e.g., the third plot 330 representing the cell with the candidate defect causing the transition delay) crosses the midpoint voltage, Vmid in response to the change at the input signal. The defect analyzer records this time interval as a defect delay, $Delay_{fn}$ that is caused by the particular candidate defect represented by the third plot 330 (e.g., setting the resistor R4 234 of FIG. 2 to a open in the given example). The defect analyzer can employ Equation 1 to calculate and record a delta delay, Delay$_\Delta$ that represents a change, in percentage of delay that is caused by the inclusion of the candidate defect modeled in the third plot 330 for the two-cycle test pattern applied.

$$Delay_\Delta = \frac{Delay_{fn} - Delay_{nom}}{Delay_{nom}} * 100 \qquad \text{Equation 1}$$

The defect analyzer can be configured to apply multiple two-cycle test patterns for each candidate defect identified in the netlist. The results can be aggregated to form a DDM and a fault rules file for the cell. Additionally, as indicated by the timing diagram 300, the input slew and/or the output load provided in the IC data (or selected by default) can impact the nominal delay, Delay$_{norm}$ and the delta delay, Delay$_\Delta$.

FIG. 4 illustrates an example of a DDM that could represent the cell (an AND gate) in the given example. In the DDM 400, a first box 404 identifies and characterizes four two-cycle test patterns, labeled p1 . . . p4. For instance, in the given example, the two-cycle test pattern p1 is labeled as (In) 01:11, (Out) 01 and (ND) "ND". This labeling indicates that in a first test pattern, a logical 0 is applied to node A, and a logical 1 is applied to node B, and that an expected response at the output node, Y is a logical 0. Additionally, this labeling also indicates that in a second test pattern, a logical 1 is applied to node A and to node B, and that the expected response at the output node, Y is a logical 1. Furthermore, the labeling "ND" of p1 represents a recorded nominal delay, Delay$_{nom}$ for the test pattern, p1 (e.g., the transition delay for a defect-free version of the cell). Values at "ND" are stored as integer or floating point numbers.

Additionally, the DDM 400 includes 41 by 4 results matrix 408 wherein each of the 41 columns represents a recorded result of a corresponding two-cycle test pattern for a particular candidate defect. That is, each column represents a response to four two-cycle test patterns, p1 . . . p4 by a particular version of the cell where one defect is modeled. Values in the results matrix 408 of the DDM 400 recorded as a 0 indicate that the particular defect did not have a detectable change on the operation of a cell for a corresponding test pattern. For instance, the value stored in the results matrix 408 at column 3, row 3 indicates that the two-cycle test pattern p3 (11:01; 10; "ND") in the first box 404 has a value of 0. This indicates that the two-cycle test pattern, p3 is not employable to detect the particular candidate defect modeled in column 3.

Additionally, values in the results matrix 408 of the DDM 400 recorded as a 1 indicate that the particular defect is a static defect detected by the corresponding test pattern. For instance, the value stored at column 4, row 4 indicates that the two-cycle test pattern p4 (11:10; 10; "ND") has a value of 1. This indicates that the two-cycle test pattern, p4 is employable to detect a static defect for the particular candidate defect model in column 4.

A recorded value of 'X' in the indicates that the corresponding test pattern is not employable to detect a defect caused by the candidate defect of the corresponding column due to non-convergence. Furthermore, in the given example, the value at column 10, row 4 in a second box labeled 412 is set to 'X', indicating that due to non-convergence, two-cycle test pattern p4 is not employable to detect a defect caused by the particular candidate defect modeled in column 10.

Further, a recorded value of 'N' represents a percent deviation from a corresponding nominal delay 'ND' caused by applying a corresponding test pattern for a particular candidate defect. The 'N' is recorded as a floating point or integer number in the results matrix 408 of the DDM 400. For instance, a fourth box 420 around a value at column 31, row 3 is set to 'N'. In one example, suppose the value at the fourth box 420 is set to a value of "20.4". This would indicate that for test pattern, p3 (11:01; 10; "ND"), the candidate defect represented in column 31 causes a detectable delay of 20.4% relative to the nominal delay value stored as "ND" for p4 in the first box 404. Accordingly, the DDM 400 not only identifies transition delays caused by candidate defects of the cell, but also quantifies the amount of delay caused by the candidate defects (recorded as values 'N').

The DDM 400 also include a one row sum matrix 424 that stores integer values characterizing a number of test patterns p1 . . . p4 that are employable to detect a particular defect. For instance, in a fifth box 428, a value of 2 is stored at column 5 of the one row sum matrix 424 of the DDM 400. This value indicates that two different two-cycle tests (namely p1 and p2) are employable to detect the candidate defect modeled in column 5.

As noted, the defect analyzer 186 generates a fault rules file that corresponds to the DDM. The fault rules file provides similar information as the DDM in a format consumable by an IC test engine, such as the IC test engine 150 of FIG. 1.

Referring back to FIG. 1, the fault rules files 158 for each of the K number of cell types 134 of the cells 132 included in the IC design 108 are provided to the IC test engine 150 for the generation of cell-aware test patterns for the fabricated IC chip 104 using untimed ATPG techniques.

Additionally, the IC data 190 can include information characterizing a minimum defect delay size, a maximum defect delay size or a range of defect delay sizes for detection. For instance, the IC data 190 could specify that the IC test engine 150 should test for defects that cause a delay of 800 ps or more. The IC test engine 150 can employ untimed ATPG techniques to generate cell-aware test patterns for the fabricated IC chip 104 based on the fault rules files 158, the IC design 108 and the IC data 190. More specifically, the IC test engine 150 can examine the fault rules files 158 and the IC data 190 to generate a test pattern for each of the cells 132 in the IC design 108. The test-patterns are considered "cell-aware" because the cell-aware test patterns are generated based on candidate defects within boundaries of the cells 132 of the IC design 108. That is, rather than conventional test patterns that treat each cell as a "black box", the cell-aware test patterns that are generated by the IC test engine 150 are tailored for specific defect candidates that are possible based on the internal circuit design of cells. Additionally, employing untimed ATPG techniques to generate the cell-aware test patterns obviates the need for knowledge of path delays for individual instances of the cells 132 of the IC design 108.

Further, as noted, the IC data 190 can include information characterizing a minimum defect delay size, a maximum defect delay size or a range of defect delay sizes. For instance, the IC data 190 can specify that the fabricated IC chip 104 is to be tested for defect that cause a delay of 0.5 ns (500 ps) or more (e.g., a minimum defect delay size quantified in the IC data 190). The minimum defect delay size, the maximum defect delay size or the range of defect delay sizes can be based, for example, on the environment of implementation for the fabricated IC chip 104. In this situation, the IC test engine 150 can filter (remove) the candidate defects for which to generate ATPG test patterns or filter (remove) test patterns that test for candidate defects that cause a transition delay of less than 0.5 ns (500 ps). Such filtering of test patterns reduces the number of cell-aware test patterns needed to test the fabricated IC chip 104.

The IC test engine 150 generates and outputs the cell-aware test patterns 198. The cell-aware test patterns 198 are employable by automatic test equipment (ATE) 194 to test the fabricated IC chip 104. In some examples, the cell-aware test patterns 198 are stored in the memory 116 and/or the ATE 194 prior to execution of the testing. The ATE 194 can alternatively be referred to as an IC chip tester or an IC chip tester machine. The ATE 194 can be implemented as a hardware device that is electrically coupled to pins on the fabricated IC chip 104. In the examples illustrated, such pins can be coupled to the interface 140 of the fabricated IC chip 104.

The cell-aware test patterns 198 employed by the ATE 194 contain stimuli to be applied to inputs and the expected values on the outputs of the fabricated IC chip 104. The ATE 194 is configured such that if the measured value by the ATE 194 is different from the expected value specified in the cell-aware test patterns 198, the ATE 194 stores the failure data. The failure data can be sent to the IC test engine 150 later to determine the cause of one or more failures in the IC chip 104. In situations where application of the cell-aware test patterns 198 indicates that the fabricated IC chip 104 is operating properly (e.g., within acceptable tolerances), the fabricated IC chip 104 can be approved for deployment. In situations where the application of the cell-aware test patterns 198 indicates that the fabricated IC chip 104 is not operating properly (e.g., one defect causes a transition delay that is greater than a default acceptable size and/or a transition delay that is greater than the maximum defect size quantified in the IC data 190 and/or a static defect is detected), the fabricated IC chip 104 can be rejected, such that the fabricated IC chip 104 is not deployed.

The cell-aware test patterns 198 generated by the IC test engine 150 vary considerably based on the architecture of the IC design 108 by the fabricated IC chip 104 and the specific environment in which the fabricated IC chip 104 is designed to operate. To accommodate such variety, the cell-aware test patterns 198 generated by the IC test engine 150 are filtered based on the IC data 190. Moreover, the cell-aware test patterns are based on the fault rules files 158 that include a value quantifying a delta delay, $Delay_\Delta$ relative to a corresponding nominal delay, $Delay_{norm}$ for each candidate defect that may cause a particular candidate defect. Additionally, the nominal delay, $Delay_{norm}$ can be tuned for each cell type 134 of the cells 132 of the fabricated IC chip based on the input slew rate and/or the output load of each of the K number of cell types 134, or some subset thereof. In this manner, in addition to testing for static defects, the cell-aware test patterns can test for specific defects that are within instantiated versions of the cells 132 of the fabricated IC chip 104. Accordingly, by employing untimed ATPG techniques (as opposed to timed transition ATPG techniques) the IC test engine 150 may generate relatively few test patterns to test the fabricated IC chip 104, and the cell-aware test patterns 198 can be executed on the fabricated IC chip 104 relatively quickly.

Figure 5:
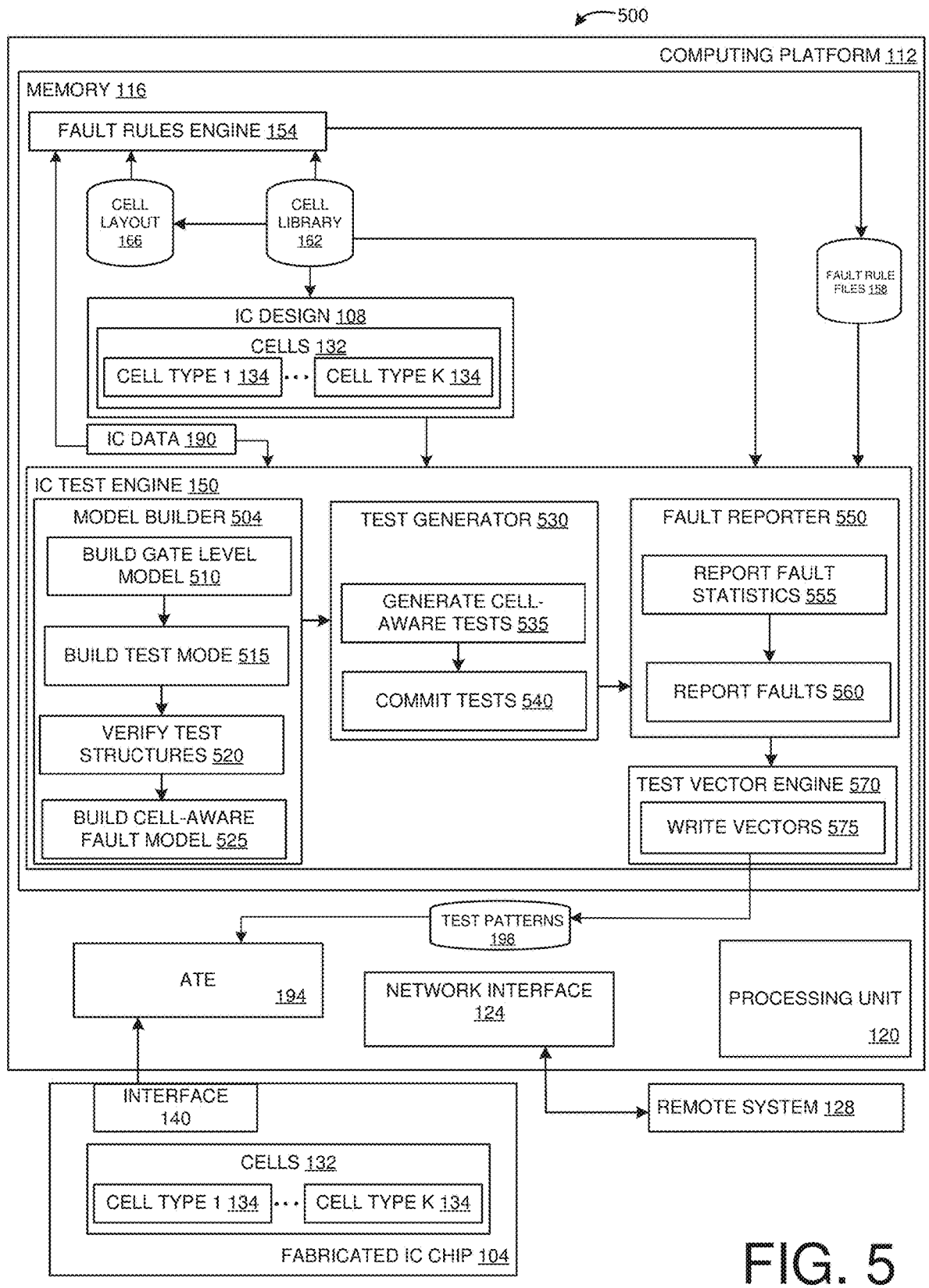
FIG. 5 illustrates another example of a system for testing a fabricated IC chip that is based on an IC design.

FIG. 5 illustrates a system 500 for testing a fabricated IC chip 104. The system 500 is similar to the system 100 of FIG. 1 with a detailed view and description of the IC test engine 150. Thus, for purposes of simplification of explanation, the same reference numbers are employed in FIGS. 1 and 5 to denote the same structure. Additionally, some reference numbers are not re-introduced. The IC design 108 can be stored in the memory 116 of the computing platform 112. The IC design 108 can be implemented, for example, as design specifications for an IC chip. The fabricated IC chip 104 represents a physical instantiation of the IC design 108, and the interface 140 can enable external systems to provide stimuli to the components of the fabricated IC chip, including the cells 132 of the fabricated IC chip 104.

The IC test engine 150 stored in the memory 116 is configured to generate untimed ATPG techniques to ensure proper operation of the fabricated IC chip 104. The ATE 194 is configured such that if the measured value by the ATE 194 is different from the expected value specified in the cell-aware test patterns 198, the ATE 194 stores the failure data. The failure data can be sent to IC test engine 150 later to determine the cause of one or more failures in the IC chip 104

The IC test engine 150 can operate in concert with the fault rules engine 154 stored in the memory 116. The fault rules engine 154 can be configured/programmed to generate fault rules files 158 using untimed transition ATPG techniques. In some examples, the fault rules engine 154 generate DDMs that each represents a user-readable format of a corresponding fault rules file 158. Each fault rule file 158 represents a set of fault rules for a particular cell type 134 that corresponds to a cell that is selected from a cell library 162. The cell library 162 can include, but is not limited to, data characterizing a physical layout of each of the K number of cell types 134 in the cells 132 of the IC design 108 and the fabricated IC chip 104. The cell library 162 can also include structural Verilog (.v), behavioral Verilog (.v) and timing models (.lib).

To generate the fault rule files 158, the fault rules engine 154 can read a cell layout 166 from the cell library 160. The cell layout 166 can characterize a physical layout for a particular cell type 134 extracted from the cell library 162. The fault rules engine 154 generates a particular fault rule file 158 of the fault rule files 158 based on the cell identified in the cell layout 166. Each fault rule file 158 can provide information similar to the information included in the DDM 400 described with respect to the given example. Thus, each of the fault rule files 158 can identify a numeric value quantifying a nominal delay, $Delay_{norm}$ of cell-aware test patterns and percentage values quantifying delta delays, $Delay_\Delta$ for each candidate defect that may cause a transition delay.

Additionally, IC data 190 characterizing selectable attributes of the IC design 108 can be provided to the fault rules engine 154 and the IC test engine 150. In some examples, the IC data 190 can be provided, for example, in response to user input. For instance, the IC data 190 can be generated during or after the IC design 108 is being generated. The IC data 190 can include information for each cell type 134 included in the IC design 108, or some subset thereof. This information can include, for example, an input slew rate and output load for each of the K number of cell types 134 in the cells 132. The input slew rate and output load can be based, for example, on a-priori knowledge of delay paths in the IC design (e.g., as an average input slew rate and/or average output load for each cell type 134, or some subset thereof). The fault rules engine 154 can employ the IC data 190 to measure the nominal delay and the delta delay of each of the fault rules files 158 or some subset thereof. In situations where the input slew rate and output load are omitted for a cell type 134, the fault rules engine 154 can employ default values to measure the nominal delay and the delta delay for the cell type 134.

The fault rules files 158 for each of the K number of cell types 134 of the cells 132 included in the IC design 108 are provided to the IC test engine 150 for the generation of cell-aware test patterns for the fabricated IC chip 104 using untimed transition ATPG techniques that disregards path delays to individual cells 132 of the IC design 108.

Additionally, the IC data 190 can include information characterizing a threshold defect size for detection. For instance, the IC data 190 could specify that the IC test engine 150 should test for defects that cause a delay of 800 ps or more.

The IC test engine 150 can represent a plurality of software modules operating in an ordered sequence to generate the cell-aware test patterns using untimed ATPG techniques. The IC test engine 150 includes a model builder 504 that can build a model of the IC design 108 that is employable to generate the cell-aware test patterns to test the fabricated IC chip 104. To build the model of the IC design 108, the model builder 504 can execute model builder operations. More particularly, at 510, the model builder 504 builds a gate level model of the IC design 108. At 515, the model builder 504 builds a test mode. The build test mode reads test pin specifications and creates a test mode view given these test pin specifications. Such test pin specifications, among other things, can include scan input pin names, scan output pin names, test clock pin names, set/reset pin names and other constraints necessary to put the design in a test mode.

At 520, the model builder 504 verifies the presence of test structures in the gate level model of the IC design 108. The test structures represent scan and test circuitry present in the IC design 108 to facilitate the application of cell-aware test patterns to the fabricated IC chip 104. The operations at 520 also check if the IC design 108 complies with test design rules given the test constraints/specifications read in 515. For example, the operations at 520 can verify that the flops in the IC design 108 can be controlled by specified test clocks, and can verify that these test clocks can be controlled properly through primary input pins. Additionally, the operations at 520 can verify that set/reset to flops be controlled through primary input pins or are the flops are in an off state.

Figure 6:
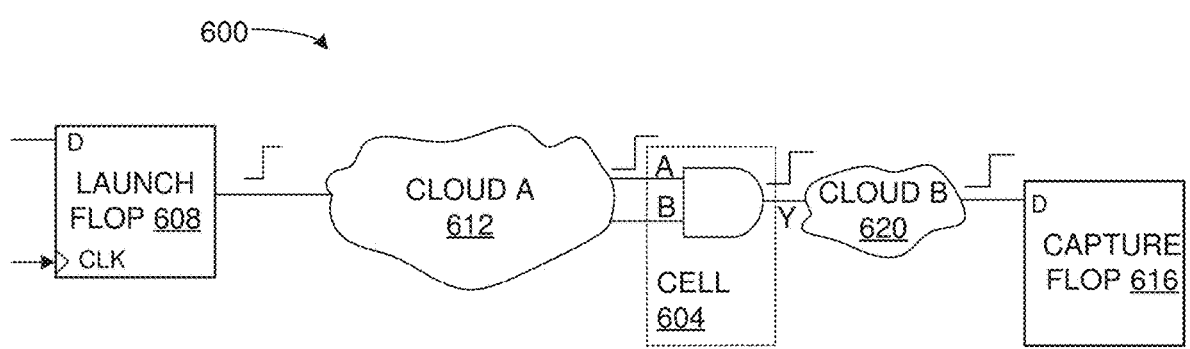
FIG. 6 illustrates a diagram of a testing structure for a cell.

FIG. 6 illustrates a simplified circuit diagram 600 illustrating a simplified example of a testing structure for a cell 604. The cell 604 is employable as one of the K number of cell types 134 of FIGS. 1 and 5. More particularly, the cell 604 represents an AND gate, consistent with the given example. The circuit diagram 600 also includes a launch flop 608 that is configured to apply a test pattern to the cell 604. A first cone of logic labeled "cloud A" 612 is coupled between the launch flop 608 and the cell 604. Cloud A 612 is upstream from the cell 604, and is coupled to input nodes, A and B of the cell 604 in the given example.

A capture flop 616 is configured to capture an output response provided by the cell 604. The capture flop 616 can be implemented, for example, as a D flip-flop. In the given example, the capture flop 616 captures an output response of the cell 604, such as node Y in the given example. A second cone of logic labeled as "cloud B" 620 is coupled between the capture flop 616 and the cell 604.

Path delays of cloud A 612 and cloud B 620 can impact the testability of the cell 604. For instance, the internal configuration of cloud A 612 can impact an input slew rate of the cell 604 and the internal configuration of cloud B can impact an output load of the cell 604.

Referring back to FIG. 5, at 525, the model builder 504 can employ the fault rules files 158 and the gate level design to build a cell-aware fault model for the IC design 108. The cell-aware fault model includes candidate defects represented as shorts or opens identified by the fault rules engine 154. The cell-aware fault model built by the model builder 504 can be provided to a test generator 530 of the IC test engine 150.

The test generator 530 can execute test generation operations. More particularly, at 535, the test generator 530 can employ untimed ATPG techniques to generate cell-aware test patterns for the fabricated IC chip 104 based on the cell-aware fault model generated by the model builder 504. More specifically, the IC test engine 150 can examine the fault rules files 158 and the IC data 190 to generate a test pattern for each of the cells 132 in the IC design 108. The test-patterns are generated based on candidate defects within boundaries of the cells 132 of the IC design 108. Additionally, employing untimed ATPG techniques to generate the cell-aware test pattern obviates the need for knowledge of path delays for individual instances of the cells 132 of the IC design 108.

At 540 the test generator 530 commits a subset of the cell-aware test patterns to test the fabricated IC chip 104 based on the IC data 190. As noted, the IC data 190 can include information characterizing a minimum defect delay size, a maximum defect delay size or a range of defect delay sizes. For instance, the IC data 190 can specify that the fabricated IC chip 104 is to be tested for defects that cause a transition delay of 0.5 ns (500 ps) or more (e.g., quantified as the minimum defect delay size). The minimum defect delay size, the maximum defect delay size or the range of defect delay sizes can be based, for example, on the environment of implementation for the fabricated IC chip 104. In some example of this situation, the test generator 530 can filter (remove) test patterns that test for candidate defects that cause a transition delay of less than 0.5 ns (500 ps). As an alternate approach, the filtering can be executed at 525. In this situation, particular candidate defects that are not detectable within the minimum defect delay size (e.g., 0.5 ns (500 ps) in the present example) are removed from the cell-aware fault model 525. Such filtering of test patterns and/or candidate defects reduces the number of cell-aware test patterns needed to test the fabricated IC chip 104 such that a subset of the test patterns generated at 535 are employed as the cell-aware test patterns 198 to test the fabricated IC chip 104.

The IC test engine 150 can include a fault reporter 550 that can execute operations related to fault reporting. More particularly, at 555 the fault reporter 550 can generate report fault statistics that characterize, for example data related to the cell-aware test patterns applied to the fabricated IC chip 104. Additionally, at 560, the fault reporter 550 can generate fault reports for the fault statistics and cell defect statistics.

A test vector engine 570 of the IC test engine 150 can convert the cell-aware test patterns into a format consumable by the ATE 194. In particular, at 575, the test vector engine 570 can generate write vectors that implement the cell-aware test patterns 198 that are employable by the ATE 194. The cell-aware test patterns 198 can be stored, for example, on the memory 116 and/or at the ATE 194.

The ATE 194 stimulates inputs of the fabricated IC chip as dictated by the cell-aware test patterns 198 and the ATE 194 is configured to compare a measured output of the fabricated IC chip 104 with expected values stored in the cell-aware test patterns 198. In case of mismatch, a failure log is generated by ATE 194. At a subsequent time, this failure log can be converted into a format readable by the IC test engine 150 to analyze the cause of failures at the fabricated IC chip 104.

The cell-aware test patterns 198 generated by the IC test engine 150 vary considerably based on the architecture of the IC design 108 by the fabricated IC chip 104 and the specific environment in which the fabricated IC chip 104 is designed to operate. To accommodate such variety, the cell-aware test patterns 198 generated by the IC test engine 150 are filtered (e.g., by filtering candidate defects and/or test patterns) based on the minimum defect delay size included in the IC data 190. In this manner, in addition to testing for static defects, the cell-aware test patterns implemented by the write vectors can test for specific defects that are within instantiated versions of the cells 132 of the fabricated IC chip 104.

Figure 7:
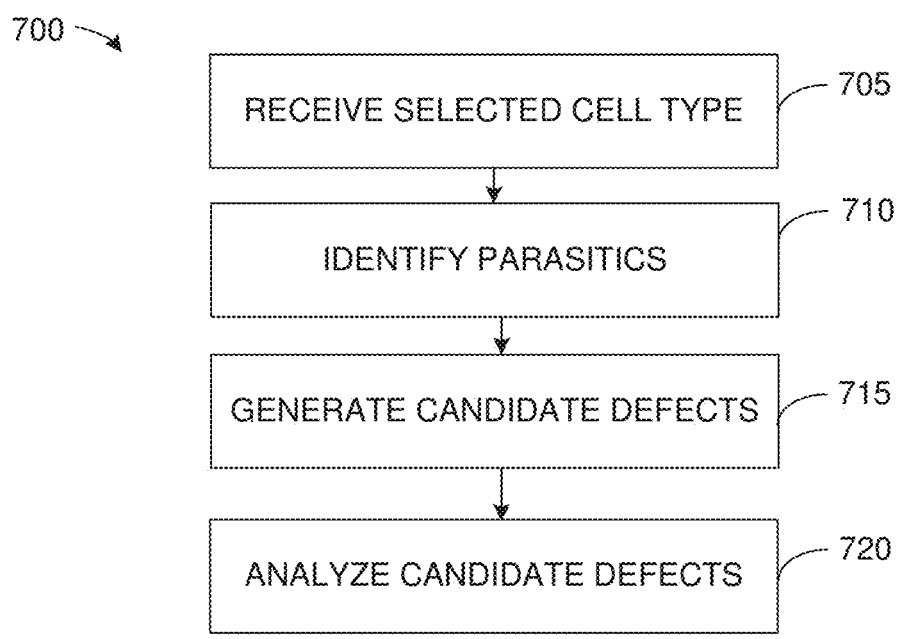
FIG. 7 illustrates a flowchart of an example method for generating a fault rules file for a selected cell type.

In view of the foregoing structural and functional features described above, example methods will be better appreciated with reference to FIG. 7. While, for purposes of simplicity of explanation, the example methods of FIG. 7 is shown and described as executing serially, it is to be understood and appreciated that the present examples are not limited by the illustrated order, as some actions could in other examples occur in different orders, multiple times and/or concurrently from that shown and described herein. Moreover, it is not necessary that all described actions be performed to implement a method.

FIG. 7 illustrates a flowchart of an example method 700 for generating a fault rules file for a particular cell type. The method 700 can be executed, for example, by a fault rules engine operating on a computing platform, such as the fault rules engine 154 of FIG. 1.

At 705, the fault rules engine can receive a selected cell type from a plurality of cell types for an IC chip design. The selected cell type can be provided, for example, as a cell layout, such as the cell layout 166 of FIG. 1. At 710, the fault rules engine can identify parasitic components within the cell. At 715, the fault rules engine can generate a plurality of candidate defects for the selected cell type, wherein each candidate defect corresponds to a parasitic component identified in the netlist, transistor terminals or to a defect location identified by the fault rules engine. Each candidate defect can be modeled as an open or a short in the netlist. At 720, the fault rules engine can analyze each candidate defect with a set of two-cycle test patterns to determine an impact of the candidate defect on the selected cell to generate a fault rules file for the selected cell type, wherein the fault rules file includes data quantifying (e.g., an integer or a floating point number) a nominal delay for a particular two-cycle test pattern of the set of two-cycle test patterns and data quantifying (e.g., an integer or a floating point number) a delta delay for the particular two-cycle test pattern corresponding to a particular candidate defect of the plurality of candidate defects. The method 700 can be repeated to generate a fault rules file for each cell type in an IC design.

The fault rules file can be provided to an IC test engine 150 of FIGS. 1 and 5). In response, the IC test engine can generate cell-aware test patterns for the fabricated IC chip employing untimed ATPG techniques. The cell-aware test patterns can be based, for example, on the fault rules file for the selected cell type and on IC data (e.g., the IC data 190 of FIGS. 1 and 5) for the IC design.

Figure 8:
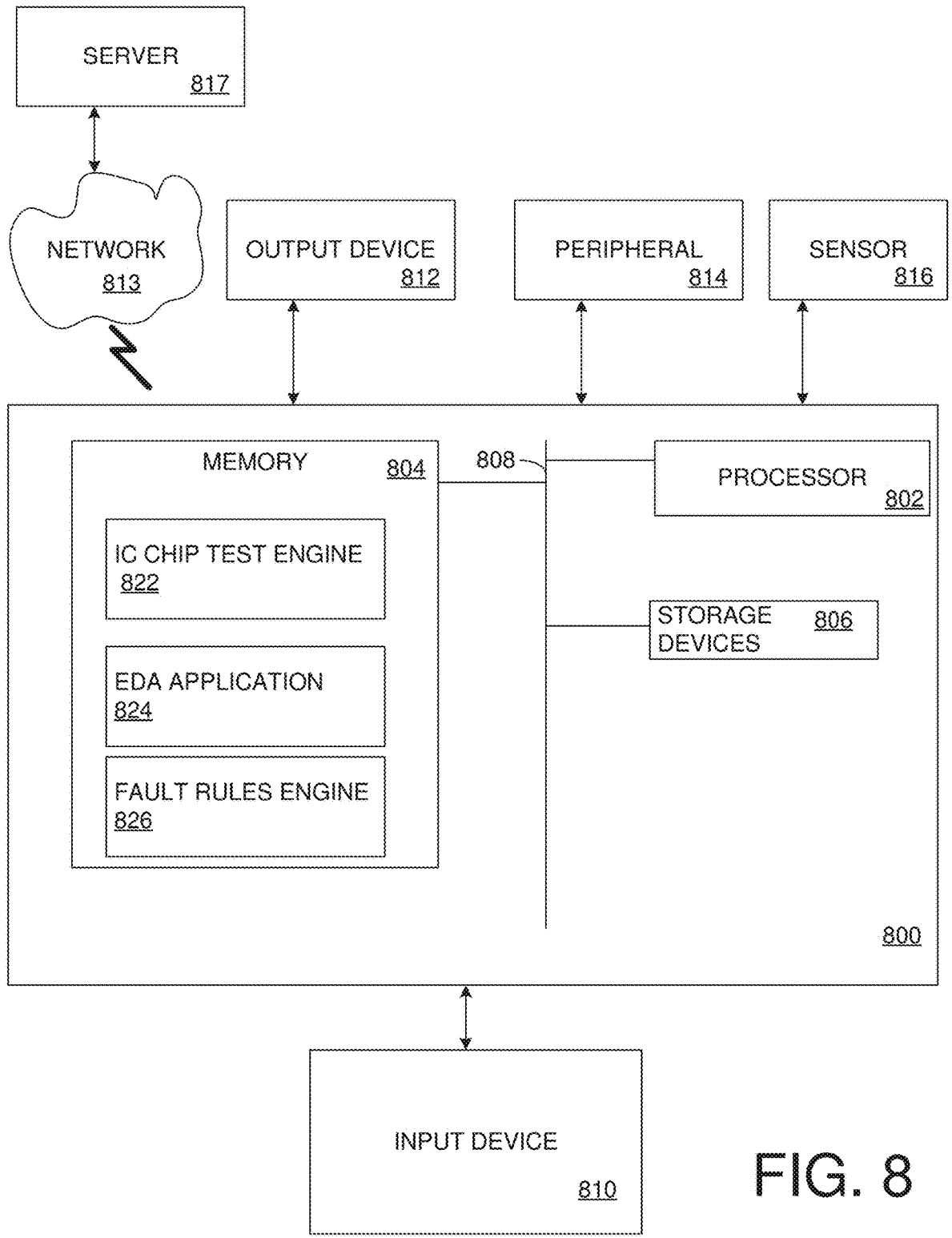
FIG. 8 illustrates an example of a computing system employable to execute an IC test engine and a fault rules engine.

The examples herein may be implemented on virtually any type of computing system regardless of the platform being used. For example, the computing system may be one or more mobile devices (e.g., laptop computer, smart phone, personal digital assistant, tablet computer, or other mobile device), desktop computers, servers, blades in a server chassis, or any other type of computing device or devices that includes at least the minimum processing power, memory and input and output device(s) to perform one or more embodiments. As shown in FIG. 8, the computing system 800 can include a computer processor 802, associated memory 804 (e.g., RAM), cache memory, flash memory, etc.), one or more storage devices 806 (e.g., a solid state drive, a hard disk drive, an optical drive such as a compact disk (CD) drive or digital versatile disk (DVD) drive, a flash memory stick, etc.) and numerous other elements and functionalities. The computer processor 802 may be an IC chip for processing instructions. For example, the computer processor may be one or more cores, or micro-cores of a processor. Components of the computing system 800 can communicate over a data bus 808.

The computing system 800 may also include an input device 810, such as any combination of one or more of a touchscreen, keyboard, mouse, microphone, touchpad, electronic pen, or any other input device. Further, the computing system 800 can include an output device 812, such as one or more of a screen (e.g., light emitting diode (LED) display, an organic light emitting diode (OLED) display, a liquid crystal display (LCD), a plasma display, touchscreen, cathode ray tube (CRT) monitor, projector, or other display device), a printer, external storage, or any other output device. In some examples, such as a touch screen, the output device 812 can be the same physical device as the input device 810. In other examples, the output device 812 and the input device 810 can be implemented as separate physical devices. The computing system 800 can be connected to a network 813 (e.g., LAN, a wide area network (WAN) such as the Internet, a mobile network, or any other type of network) via a network interface connection (not shown). The input device 810 and output device(s) 812 can be connected locally and/or remotely (e.g., via the network 813) to the computer processor 802, the memory 804 and/or the storage devices 806. Many different types of computing systems exist, and the aforementioned input device 810 and the output device 812 can take other forms. The computing system 800 can further include a peripheral 814 and a sensor 816 for interacting with the environment of the computing system 800 in a manner described herein.

Software instructions in the form of computer readable program code to perform embodiments disclosed herein can be stored, in whole or in part, temporarily or permanently, on a non-transitory computer readable medium such as a CD, DVD, storage device, a diskette, a tape, flash memory, physical memory, or any other computer readable storage medium. Specifically, the software instructions can correspond to computer readable program code that when executed by a processor, is configured to perform operations disclosed herein. The computing system 800 can communicate with a server 817 via the network 813.

The memory 804 can include an IC test engine 822 to test an IC design that is instantiated as a fabricated IC chip. The IC design can be generated, for example, by an EDA application 824. The memory 804 can also include a fault rules engine 826 for generating fault rules files and/or DDMs to facilitate the testing of the fabricated IC chip.

Further, one or more elements of the aforementioned computing system 800 can be located at a remote location and connected to the other elements over the network 813. Additionally, some examples can be implemented on a distributed system having a plurality of nodes, where each portion of an embodiment can be located on a different node within the distributed system. In one example, the node corresponds to a distinct computing device. Alternatively, the node can correspond to a computer processor with associated physical memory. The node can alternatively correspond to a computer processor or micro-core of a computer processor with shared memory and/or resources.

What have been described above are examples. It is, of course, not possible to describe every conceivable combination of components or methodologies, but one of ordinary skill in the art will recognize that many further combinations and permutations are possible. Accordingly, the disclosure is intended to embrace all such alterations, modifications and variations that fall within the scope of this application, including the appended claims. As used herein, the term "includes" means includes but not limited to, the term "including" means including but not limited to. The term "based on" means based at least in part on". Additionally, where the disclosure or claims recite "a," "an," "a first," or "another" element, or the equivalent thereof, it should be interpreted to include one or more than one such element, neither requiring nor excluding two or more such elements.

What is claimed is:

1. A non-transitory machine-readable medium having machine-readable instructions, the machine-readable instructions comprising:
  a fault rules engine that:
    generates a plurality of fault rules files, wherein each of the fault rules files is associated with a respective cell type of a plurality of cell types in an integrated circuit (IC) design, and each fault rules file of the plurality of fault rules files comprises data quantifying a nominal delay for a given two-cycle test pattern of a set of two-cycle test patterns and data quantifying a delta delay that quantifies a percentage of deviation from the nominal delay for the given two-cycle test pattern corresponding to a given candidate defect of a plurality of candidate defects for a given cell type of the plurality of cell types in the IC design; and
    generates a plurality of candidate defects for the given cell type of the plurality of cell types for a given fault rules file of the plurality of fault rules files, and each candidate defect for the given cell type corresponds to a given parasitic component of the parasitic components identified in a netlist, transistor terminals or to a defect location identified by the fault rules engine, wherein the fault rules engine comprises:
      a defect analyzer that adjusts the nominal delay of the fault rules file for each cell type based on a corresponding input slew rate and a corresponding output load extracted from IC data characterizing an input slew rate and an output load for each of the plurality of cell types; and
    an IC test engine that generates cell-aware test patterns based on the plurality of fault rules files to test a fabricated IC chip that is based on the IC design for defects corresponding to a subset of the plurality of candidate defects characterized in the plurality of fault rules files.

2. The medium of claim 1, wherein for the given fault rules file of the plurality of fault rules files, the fault rules engine:
  generates the netlist characterizing the given cell type of the plurality of cell types included in the integrated circuit (IC) design, wherein the netlist identifies parasitic components that have a potential of causing a defect in the fabricated IC chip;
  analyzes each candidate defect with a set of two-cycle test patterns to determine an impact of the candidate defect on the given cell to generate the respective fault rules file for the cell, wherein the given fault rules file includes data quantifying a nominal delay for a particular two-cycle test pattern of the set of two-cycle test patterns and data quantifying a delta delay for the particular two-cycle test pattern corresponding to a particular candidate defect of the plurality of candidate defects.

3. The medium of claim 2, wherein each candidate defect is modeled as an open or a short in a circuit design for the given cell.

4. The medium of claim 3, wherein the nominal delay and the delta delay are stored as integers or floating point numbers in the given fault rules file of the plurality of fault rules files.

5. The medium of claim 4, wherein the nominal delay for the particular two-cycle test quantifies a delay of response at an output node of a simulated defect-free version circuit design relative to a second cycle transition on an input signal of the simulated defect-free version of the circuit design.

6. The medium of claim 5, wherein the given fault rules file comprises data indicating that at least one of the plurality of candidate defects causes a static fault for a corresponding two-cycle test pattern.

7. The medium of claim 6, wherein the given fault rules file further comprises data indicating that defects caused by at least one of the plurality of candidate defects is not detectable by a corresponding two-cycle test pattern.

8. The medium of claim 2, wherein the netlist is stored in the Detailed Standard Parasitic Format (DSPF).

9. The medium of claim 1, wherein the IC test engine employs untimed Automatic Test Pattern Generation (ATPG) techniques to generate the cell-aware test patterns and the cell-aware test patterns are independent of path delays to cell instances of the IC design.

10. The medium of claim 1, wherein the IC comprises data characterizing a threshold defect size that quantifies a minimum defect delay size, a maximum defect delay size or a range of defect delay sizes for testing.

11. The medium of claim 10, wherein each of the cell-aware test patterns generated by the IC test engine tests for defects that cause detectable delays that meet or exceed the minimum defect delay size quantified in the IC data.

12. A system comprising:
  a non-transitory memory that stores machine-readable instructions; and
  a processing unit that accesses the memory and executes the machine-readable instructions, the machine-readable instructions comprising:
    an IC test engine that employs untimed Automatic Test Pattern Generation (ATPG) techniques to generate cell-aware test patterns based on a plurality of fault rules files to test a fabricated integrated circuit (IC) chip for defects corresponding to a subset of a plurality of candidate defects characterized in the plurality of fault rules files;
    wherein each of the fault rules files is associated with a respective cell type of a plurality of cell types in an IC design of the fabricated IC chip, and each fault rules file of the plurality of fault rules files comprises data quantifying a nominal delay for a given two-cycle test pattern of a set of two-cycle test patterns and data quantifying a delta delay that quantifies a percentage of deviation from the nominal delay for the given two-cycle test pattern corresponding to a given candidate defect of a plurality of candidate defects in the IC design, and each candidate defect for a given cell type of the plurality of cell types corresponds to a given parasitic component of the parasitic components identified in a netlist, transistor terminals or to a defect location; and a fault rules engine that generates each of the fault rules files, the fault rules engine comprising a defect analyzer that adjusts the nominal delay of the fault rules file for each cell type based on a corresponding input slew rate and/or a corresponding output load extracted from IC data characterizing an input slew rate and an output load for each of the plurality of cell types.

13. The system of claim 12, wherein the IC test engine generates the cell-aware test patterns independent of path delays to cell instances of the IC design.

14. The system of claim 12, wherein the IC data comprises data characterizing a threshold defect size that quantifies a minimum defect delay size, a maximum defect delay size or a range of defect delay sizes for testing the fabricated IC chip and each of the cell-aware test patterns generated by the IC test engine tests for defects that cause detectable delays that meet or exceed the minimum defect delay size quantified in the IC data.

15. A method for generating a fault rule file for testing a fabricated integrated circuit (IC) chip, the method comprising:

generating, by a fault rules engine operating on a computing platform, a netlist characterizing a selected cell type of a plurality of cell types included in an integrated circuit (IC) design for the IC chip, wherein the netlist identifies parasitic components that have a potential of causing a defect in the fabricated IC chip;

generating, by the fault rules engine, a plurality of candidate defects for the selected cell type, wherein each candidate defect corresponds to a given parasitic component of the parasitic components identified in the netlist, transistor terminals or to a defect location identified by the fault rules engine;

analyzing, by the fault rules engine, each candidate defect with a set of two-cycle test patterns to determine an impact of the candidate defect on the selected cell to generate a fault rules file for the selected cell type, wherein the fault rules file includes data quantifying a nominal delay for a particular two-cycle test pattern of the set of two-cycle test patterns and data quantifying a delta delay that quantifies a percentage of deviation from the nominal delay for the particular two-cycle test pattern corresponding to a particular candidate defect of the plurality of candidate defects; and adjusting, by a defect analyzer, the nominal delay of the fault rules file for each cell type of the plurality of cell types based on a corresponding input slew rate and a corresponding output load extracted from IC data characterizing an input slew rate and an output load for each of the plurality of cell types.

16. The method of claim 15, wherein each candidate defect is modeled as an open or a short in a circuit design for the given cell.

17. The method of claim 16, wherein the nominal delay and the delta delay are stored as integers or floating point numbers in the fault rules file.

* * * * *